United States Patent
Subramanian

(10) Patent No.: US 6,380,000 B1
(45) Date of Patent: Apr. 30, 2002

(54) AUTOMATIC RECOVERY FOR DIE BONDER WAFER TABLE WAFERMAP OPERATIONS

(75) Inventor: Balamurugan Subramanian, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/668,565

(22) Filed: Sep. 22, 2000

Related U.S. Application Data

(60) Provisional application No. 60/160,195, filed on Oct. 19, 1999.

(51) Int. Cl.$^7$ .......................... H01L 21/66; H01L 21/50
(52) U.S. Cl. ........................................ 438/113; 438/14
(58) Field of Search ............................ 438/800, 5, 14, 438/15, 113, 114, 460, 464; 700/121

(56) References Cited

U.S. PATENT DOCUMENTS

| | | | |
|---|---|---|---|
| 4,914,601 A | * | 4/1990 | Smyth, Jr. |
| 4,928,002 A | * | 5/1990 | Corley et al. |
| 5,446,584 A | * | 8/1995 | Bacchi et al. |
| 6,265,232 B1 | * | 7/2001 | Simmons |

FOREIGN PATENT DOCUMENTS

| | | | |
|---|---|---|---|
| JP | 60-103639 | * | 6/1985 |
| JP | 10-70143 | * | 3/1998 |
| JP | 10-92882 | * | 4/1998 |

\* cited by examiner

Primary Examiner—Michael J. Sherry
Assistant Examiner—Evan Pert
(74) Attorney, Agent, or Firm—Robert L. Troike; Frederick J. Telecky, Jr.

(57) ABSTRACT

An automatic recovery method for a Die Bonder Wafer Table in the event of loss of wafermap coordinate data is provided. If after moving to the first map die position and there is no die, the wafer table is moved back one die position in the direction of the track from the reference die to the first map die and then the closest coordinate from the map data of current bin in reverse direction is found and the table is moved to that position. If there is alignment fail or no die, the same step of moving back and finding the closest die coordinate from the map data in reverse direction and moving to that position is repeated. Otherwise, the next die coordinate from the map data of the current bin in reverse direction towards the first map die is found and the table is moved to this die coordinate position. The table is moved to the next die position in the forward direction if alignment fails or no die is encountered.

2 Claims, 6 Drawing Sheets

AUTOMATIC RECOVERY FOR DIE BONDER WAFER TABLE WAFERMAP OPERATIONS

This application claims priority under 35 USC § 119 (e)(1) of provisional application No. 60/160,195, filed Oct. 19, 1999.

FIELD OF INVENTION

This invention relates to Die Bonder Wafermap operations and, more particularly, to recovery in case of loss of wafermap coordinate data.

BACKGROUND OF INVENTION

Semiconductor manufacturing includes the process of moving semiconductor substrate dies from a wafer table to a lead frame after they have been cut from a silicon wafer of substrate material. A silicon wafer first is placed on an adhesive surface and is cut into rectangular dies. After cutting, the adhesive surface is placed on a wafer table of a die bonder apparatus. The die bonder deposits an adhesive on the lead frame, removes a cut die from the adhesive surface, and places it on the lead frame on the deposited adhesive. The silicon wafer from which the dies are cut is round, such that some dies are not fully rectangular. These nonrectangular dies will be left on the adhesive surface and discarded.

If the process of removing dies from a silicon wafer is automated, the position of the silicon wafer and dies must be known or estimated, to allow a robot arm to manipulate the wafer and dies. Nevertheless, the position of the silicon wafer with respect to the known coordinates of the adhesive surface may randomly change during the die cutting operation. When such random changes occur, no die may be present at some locations in which a die is expected. This condition may result in unnecessary wafer table movements to locate the cut dies.

A wafer may have dies of varying quality such as top grade dies, second grade but usable dies, and bad dies. The dies of like grade are given a given bin number and dies of the same bin are picked by the die bonder.

In the prior art in the case of loss of wafermap coordinate data, the operator needs to count the number of dies to skip by counting the picked dies in the wafer. In the case of small dies, counting is not possible.

SUMMARY OF INVENTION

In accordance with one embodiment of the present invention, a method for automatic recovery for die bonder wafer table wafermap operation is provided.

DESCRIPTION OF THE PREFERRED EMBODIMENTS OF THE PRESENT INVENTION

Figure 1:
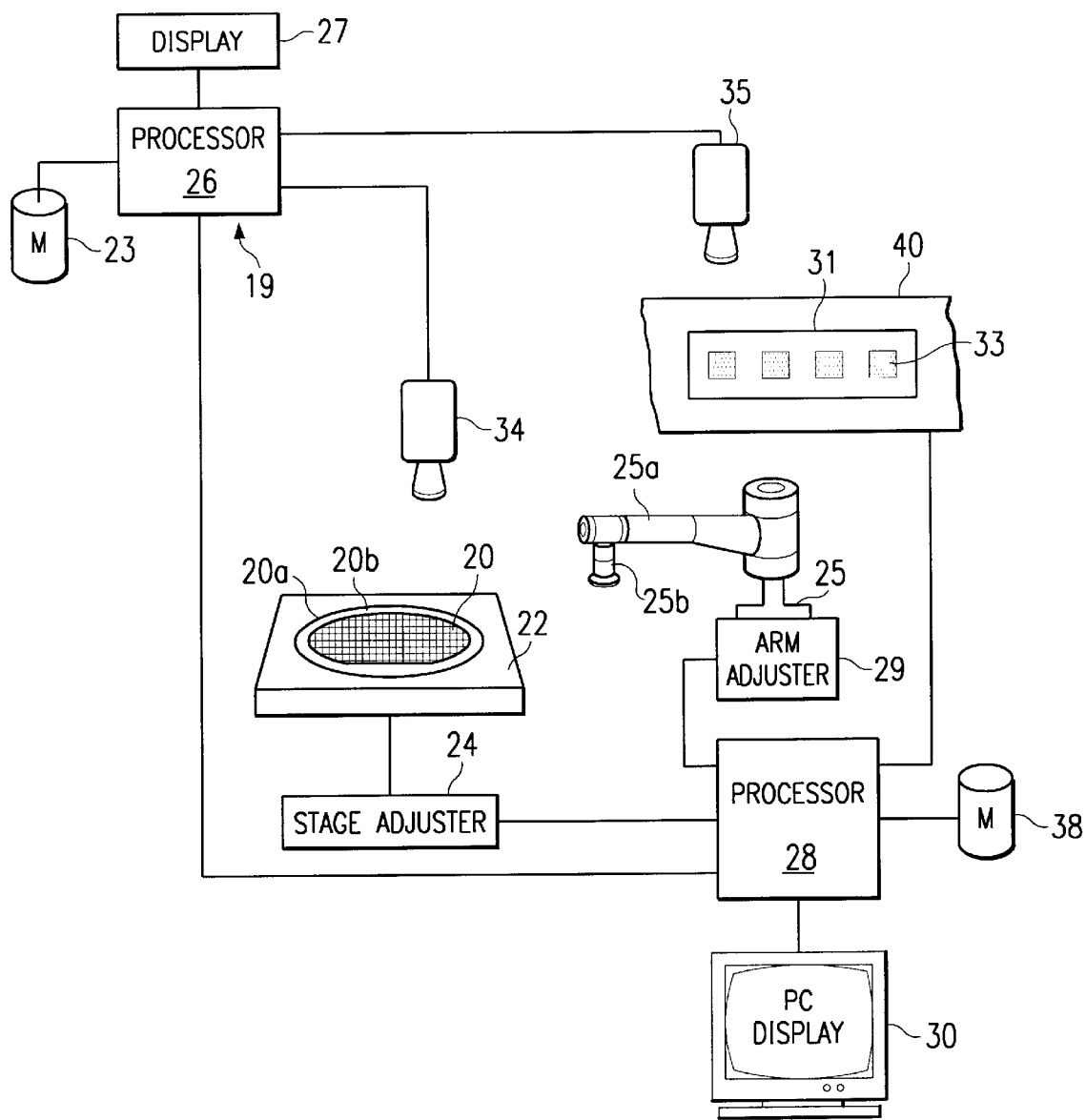
FIG. 1, illustrates a die bonder wafer table system.

Referring to FIG. 1, there is illustrated a schematic representation of an alignment system using a die bonder (die mounter or die attach) that may be used in the fabrication process of integrated circuits on silicon wafers according to the present invention. The die bonder may be, for example, Abacus AT1201 Die Bonder of Texas Instruments, Incorporated. A die bonder dispenses epoxy on a die pad of a lead frame and mounts the die to the pad. A silicon wafer 20 is carried by a table 22 which is moveable in conjunction with a table adjuster 24, which is coupled to table 22. A robot 25 of the system, including a controllable arm 25a and suction and effector 25b, picks up the die and placed the die and on pad 33 of lead frame 31 by arm adjuster 29. The robot 25 is controlled by processor 28. The lead frame handling system 40 moves and positions the lead frame to allow placement of the die. The lead frame handling system 40 also applies the epoxy to the pad 33 of lead frame 31 before the die is placed on the lead frame 31. The wafer table 22 via the adjuster 24 moves the wafer 20 to locate the next die under program control of processor 28 so that robot arm 25a picks up the die from wafer 20 and places it on pad 33 of lead frame 31. After the table 22 is moved to one good die the align system 19 takes over for good alignment initiated by processor 28. The align system 19 consists of a processor 26, display 27, storage device 23, camera 34, and camera 35. The align system 19 provides an align correction signal to align a die accurately and is coupled to processor 28. During the alignment process, an output signal is produced by processor 26 and, the output signal may be delivered to the table adjuster 24 through processor 28 so as to reposition the wafer table in response to an output signal. The substance of the output signal may also be displayed by the processor 26 on the display 27 or may be displayed on display 30. In order to perform the alignment or misregistration check, processor 26 receives a video image from a video camera 34 (such as a CCD camera) which is a subsystem of the alignment system. The camera includes the optics to focus on the wafer or lead frame. The video signal is digitized using, for example, a video to digital converter as part of the camera. Whenever an alignment is made, the processor 26 takes a picture via the camera 34 and looks for a pre-taught (stored) pattern. In one embodiment, a unique pattern is in the die and is stored and when an alignment call is made the align system takes a picture and looks for that pattern. In another embodiment, the align system takes a picture and aligns to the four sides (streets) of the die. The pattern of the integrated circuit is taught or stored in a memory of the processor 26 or memory or storage 23 at the time the device is setup. The processor 26 calculates the displacement of the stored pattern (alignment point) to current pattern and provides a correction signal. This displacement in x and y direction is the x and y correction. This correction signal a dependent on the correction value through processor 28 is sent to the wafer table adjuster 24 from processor 26 for accurately positioning of the table so the die is picked up. If the displacement is too great so the stored pattern to current pattern is too great the align system 19 will not be able to do the alignment. It is therefore very important that before alignment is done, the wafer table 22 is moved close to the alignment point. The precise location of the lead frame 31 may be determined by align system 19 using a second camera 35 (such as a CCD video camera) also coupled to the processor 26. The wafer map identifying the locations of the dies and which dies are good and their bin number or are bad are stored in the wafer map in storage 38. When bad dies have been identified, they are marked and the information is stored in the storage 38 so that the system coupled to the storage knows the bad dies and skips or jumps these bad dies. Similarly, the good dies of the same bin number are marked and the information is stored in storage 38 so the system skips to pick up the dies of the same bin number. The align system 19 gives the correct distance to the wafer table adjuster 24 to move the table 22 if not aligned sufficiently for the pickup device to pick up the die. The robot arm 25a picks up the properly aligned die and places it on the pad of the lead frame. The lead frame handling system 40 then moves the next lead frame pad into position. The present application is particularly directed to the step of accurately moving the wafer table to every good dies of the same bin number on the wafer so that the align system 19 can align the die properly and enable the robot arm 25 to pick up the good dies.

Figure 2:
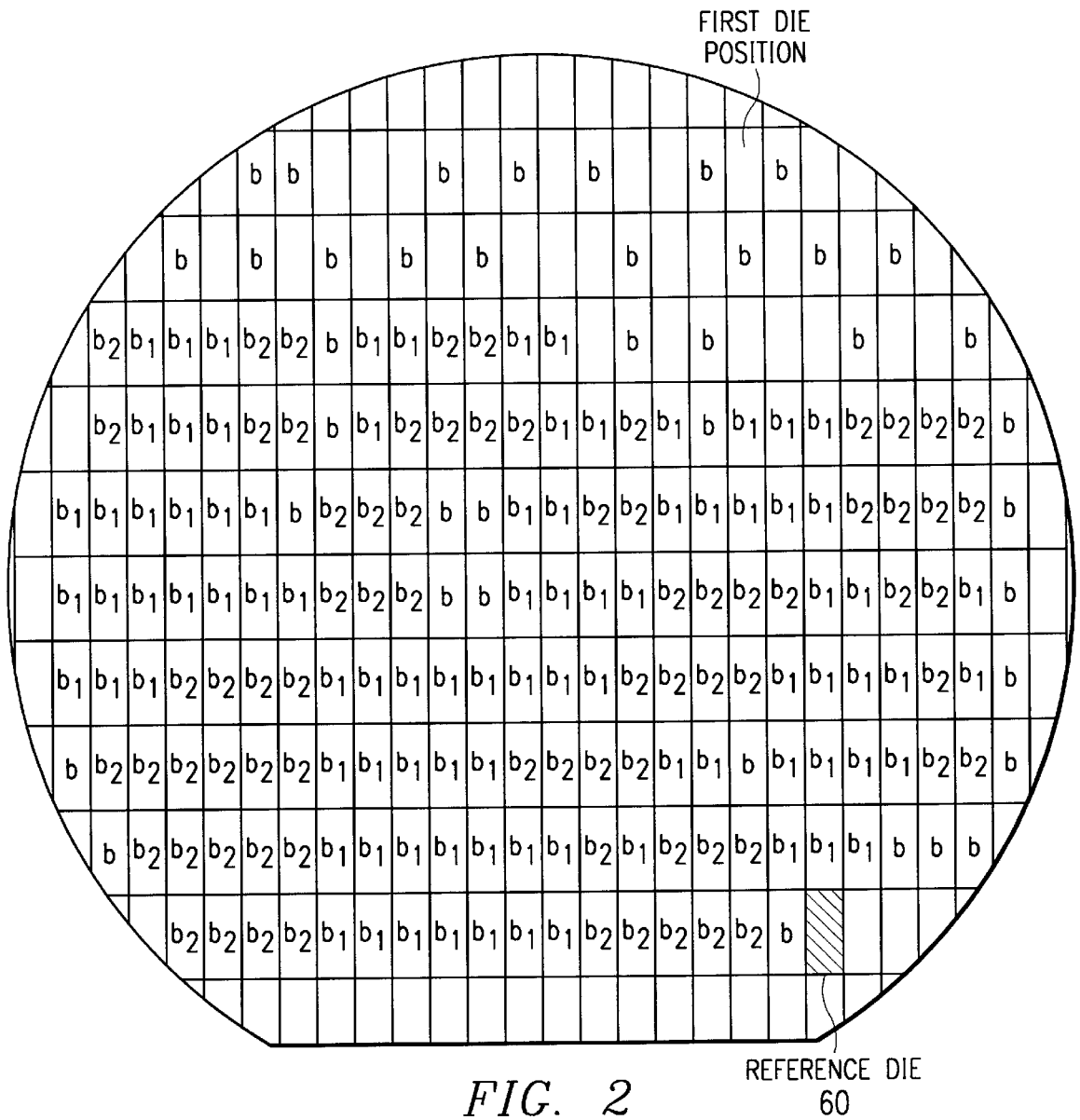
FIG. 2 illustrates a wafermap with a reference die and bad dies b; best dies $b_1$, and good dies $b_2$.

FIG. 2 illustrates a wafermap with a reference die 60 and dies. Some of the dies are bad dies labeled b and some are of different bins such as bin $b_1$ and $b_2$ where $b_1$ is the best quality dies and $b_2$ is of lesser quality.

Figure 3:
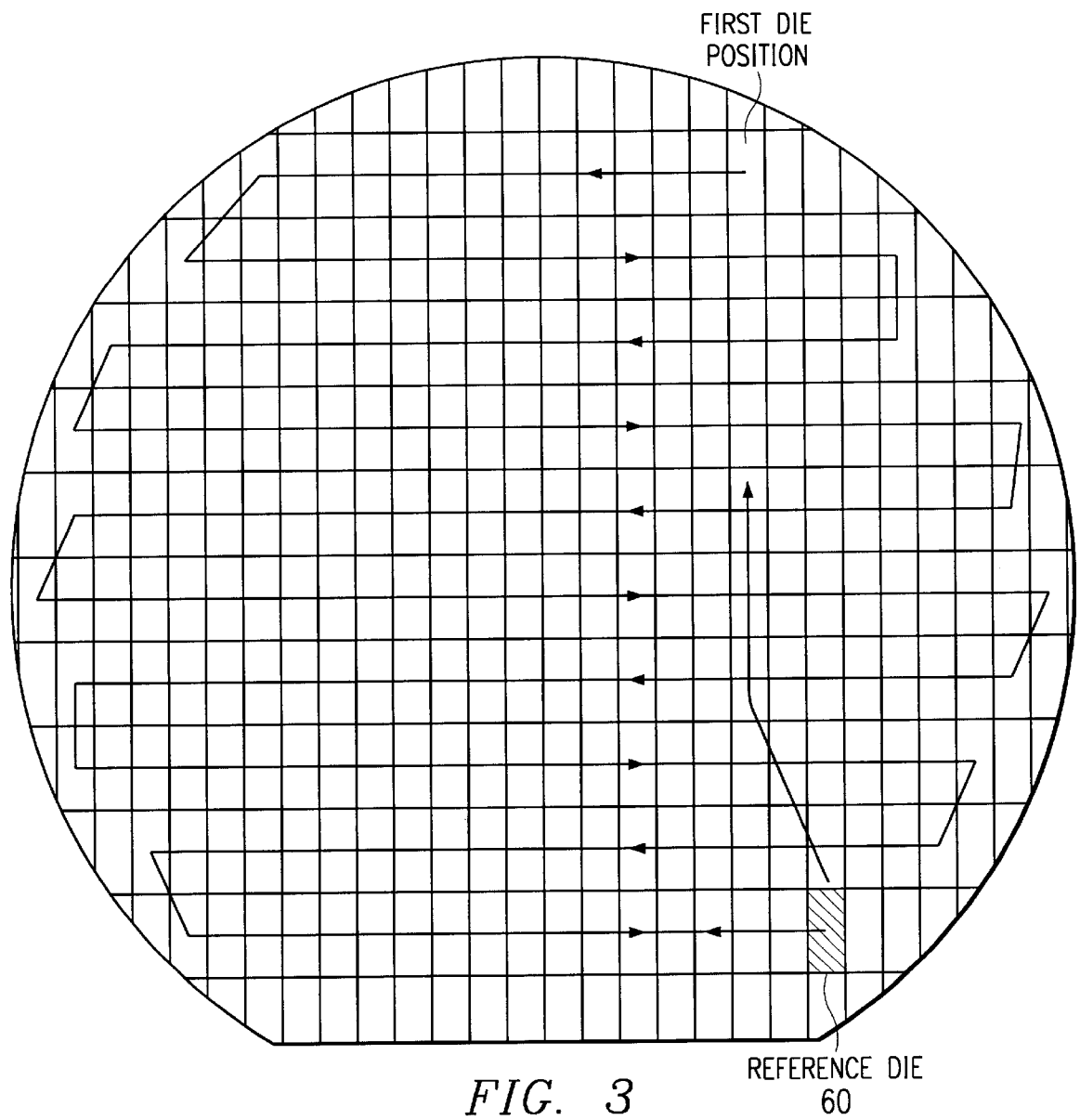
FIG. 3 illustrates the normal path to pick up dies.

FIG. 3 illustrates the normal path to pick up the dies. It starts at die position one and moves to the left across the wafer in the direction of the arrow to the left end and then down one row and then to the right across the width of the wafer, then down to the next row and then to the left across the wafer, etc.

The present invention relates to automatic recovery for the die bonder wafermap operation from where it stopped picking up dies in the case of loss of wafering coordinate data. This may be due to power failure or machine failure. The recovery is performed by computer control according to a program for which a flow chart is provided in FIG. 4.

Figure 4:
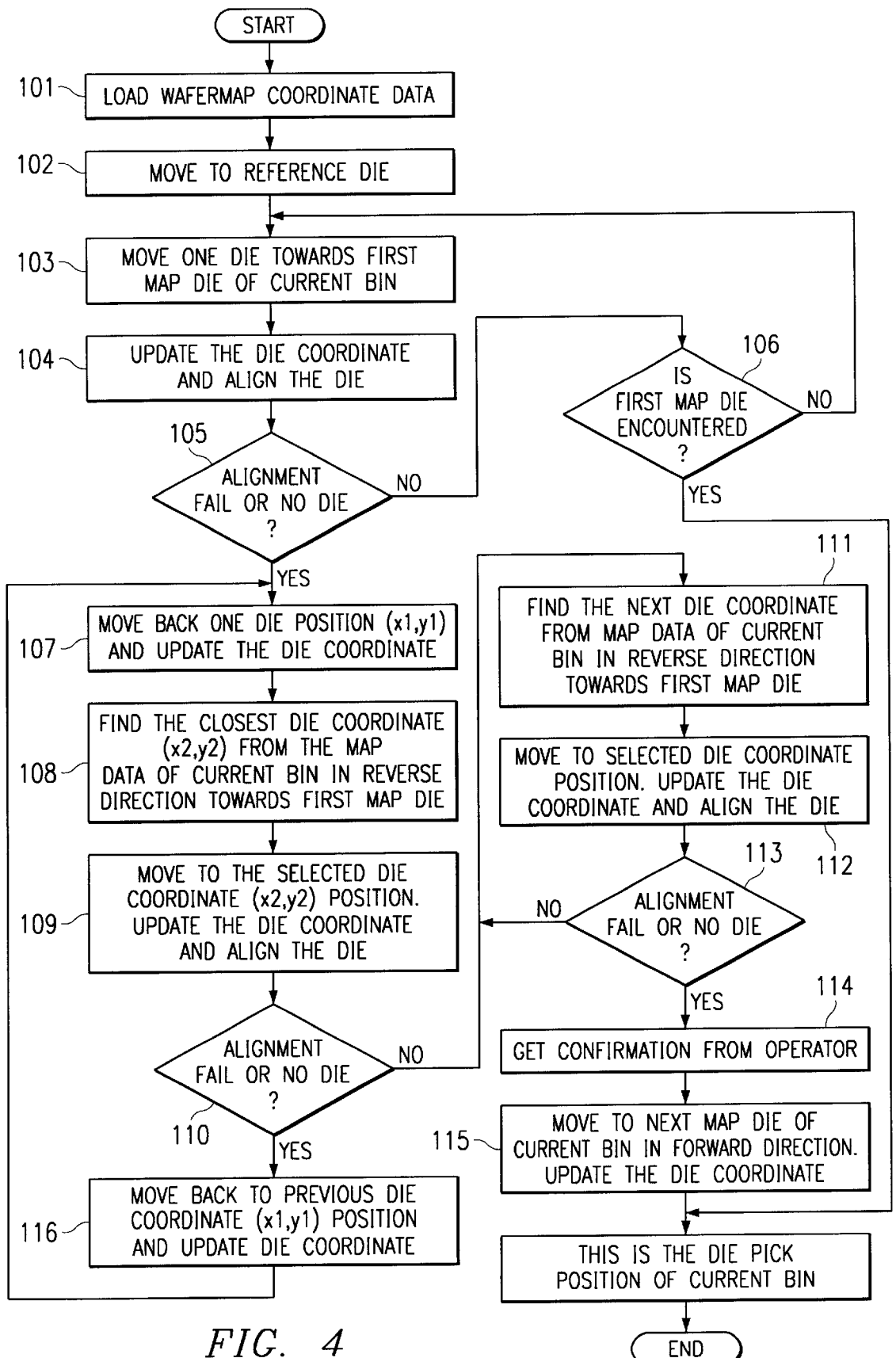
FIG. 4 is a flow chart of the operation of the system according to one embodiment of the present invention.
Figure 5:
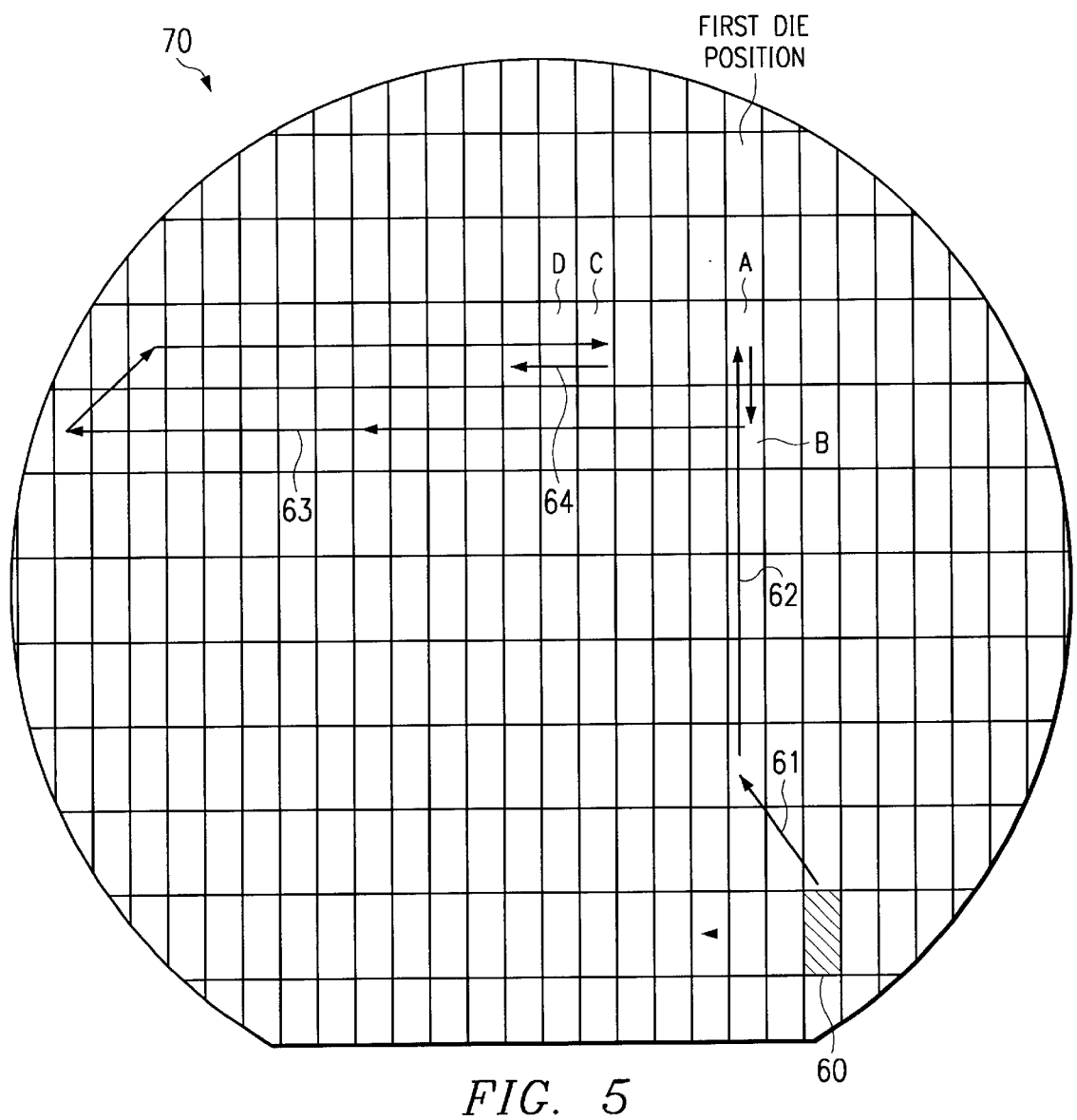
FIG. 5 illustrates a wafer and operation with some dies already picked.

Referring to FIG. 4, the wafermap coordinate data is loaded in Step 101. The reference die is found in Step 102. The reference die 60 is in the lower right corner of the wafer 70 in FIG. 5. The blank white spaces represent dies already picked. The system moves the table to the first map die of the current bin such as bin $b_1$ one die at a time. This is Step 103. Each time the system moves it updates the coordinate position and aligns the die on the wafermap. This is Step 104. If the alignment does not fail or there is a die at decision 105, then it is determined at Step 106 if the first map die is encountered. If so, this is the die pick position of the current bin. If this is not the first map die, the table moves one die towards the first map die of the current bin (Step 103). The coordinate is updated and aligned (Step 104) and if alignment does not fail or there is a die, then it is determined if the first map die is encountered. If not, the table is moved in the direction of arrows 61 and 62 toward the first map die as illustrated in wafer 70 of FIG. 5. If either alignment fails or no die at Step 105 occurs (represented by "yes") then the system moves back one die position and updates the coordinates. This is Step 107. In FIG. 5, this is represented by point A where no die is encountered. In Step 107, the movement is to point B. The next step 108 is to find the closest die coordinates from the map data of current bin reverse direction toward first map die. The next Step 109 is to move to the selected die coordinate position. The die coordinate is updated and the die is aligned. If the alignment does not fail and there is a die, the decision of Step 110 is "no" and the next die coordinate from map data of the current bin is found in reverse direction toward the first die map. This is Step 111. The table is then moved to the selected die coordinate position in Step 112 and the die coordinate is updated and the die is aligned. The decision Step 113 determines if the alignment fails or no die. If the decision is "no," table continues step by step to an alignment fail and no die. This follows the path 63 of arrows. When no die is deleted at Step 113 ("yes" decision) at point C in FIG. 5, get confirmation from operator (Step 114) and then move to the next map die of current bin in a forward direction (direction of arrow 64 (Step 115)). This is the next die pick position of current bin. If at decision Step 110 is "yes," the move is back to the previous die coordinate and then move back one die of Step 107 as discussed in the wafer of FIG. 6.

Figure 6:
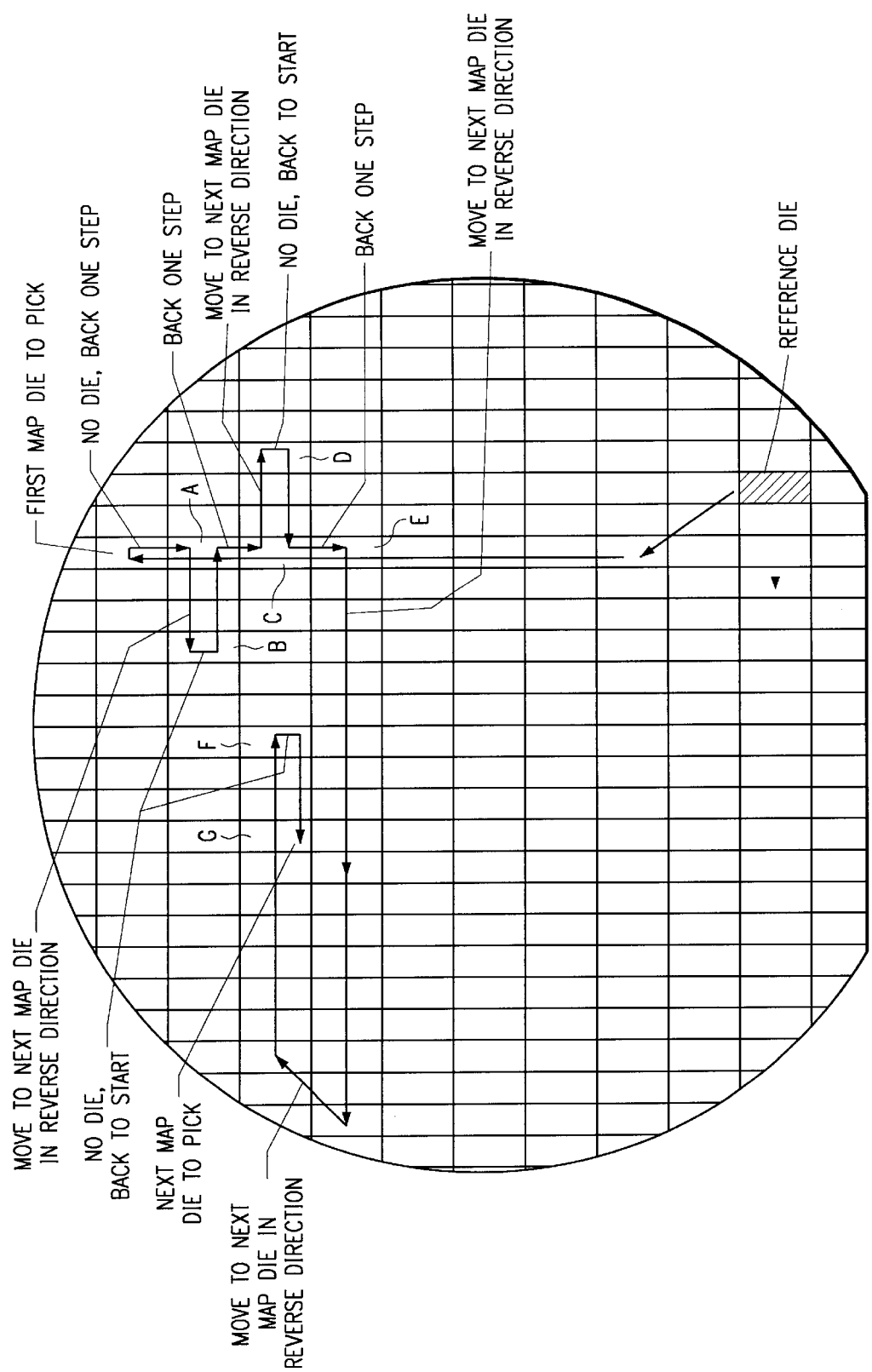
FIG. 6 illustrates a different wafer and operation with some dies already picked.

Referring to FIG. 6, this process is illustrated with a different wafer. The operation starts at the reference die and moves to the first die position, as discussed in connection with FIG. 5. The system goes step by step through Steps 103, 104, 105 and 106 to determine if the first map dies is encountered. If the first map die is not encountered, then the system moves one die at a time toward the first die map position step by step. When it reaches the first die position and there is no die, it moves back one step (Step 107) to position A in FIG. 6. The closest die coordinate is found for the current bin and moves in the reverse direction (Step 109). This is to the left. It finds no die at position B so at Step 110 there is a "yes" decision so at Step 116 the table moves back to the previous die coordinate. At Step 107, the table moves back one die position (down the page) to position C. At Step 108, it finds the closest die coordinate and moves to that position. This is to the right in FIG. 6. Again, it finds no dies (at position D) so again "yes" at Step 110 and moves back to previous die coordinate. At Step 107 the table moves back one die to position E. At this point, there is alignment and the process takes the steps as in FIG. 5 to move step by step to the no die position F in the reverse direction as determined at Step 113 and then moved forward to the next map die at position G.

What is claimed:

1. A method for automatic recovery for a wafer table wafermap operation comprising the steps of:

(a) moving said wafer table from a reference die in a first direction toward a first map die of current bin pick position of a wafer;

(b) picking the first map die of current bin if said first map die is encountered;

(c) if an alignment fail or no die is encountered, moving said wafer table back one die position along the reverse track of said first direction to the first map die;

(d) finding the closest die coordinate from the map data of current bin in reverse direction to a forward die pick up direction toward said first map die and moving said wafer table to this closest coordinate;

(e) if alignment fail or no die, repeating steps (c) and (d), otherwise finding the next die coordinate from map data of current bin in said reverse direction towards the first map die and moving said wafer table to this die coordinate position;

(f) moving said wafer table to next map die of current bin in said forward direction if alignment fail or no die; and (g) picking this next map die of the current bin.

2. The method of claim 1, wherein the step (f) includes getting confirmation from an operator there is align fail or no die.

* * * * *